US006797951B1

(12) United States Patent
Enloe

(10) Patent No.: US 6,797,951 B1
(45) Date of Patent: Sep. 28, 2004

(54) LAMINATED ELECTROSTATIC ANALYZER

(75) Inventor: Carl L. Enloe, Colorado Springs, CO (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 77 days.

(21) Appl. No.: 10/291,455

(22) Filed: Nov. 12, 2002

(51) Int. Cl.[7] .................................................. H01J 37/12

(52) U.S. Cl. ............................... 250/305; 250/396 ML; 250/396 R

(58) Field of Search ............................ 250/305, 396 R, 250/396 ML

(56) References Cited

U.S. PATENT DOCUMENTS

| | | | | |
|---|---|---|---|---|
| 4,126,781 A | | 11/1978 | Siegel | |
| 4,205,226 A | | 5/1980 | Gerlach | |
| 4,584,474 A | | 4/1986 | Franchy et al. | |
| 4,959,544 A | | 9/1990 | Sukenobu | |
| 5,032,723 A | | 7/1991 | Kono | |
| 5,107,111 A | | 4/1992 | Daimon et al. | |
| 5,120,958 A | | 6/1992 | Davis | |
| 5,180,914 A | | 1/1993 | Davis et al. | |
| 5,285,066 A | | 2/1994 | Sekine et al. | |
| 5,357,107 A | | 10/1994 | Ibach et al. | |
| 5,486,697 A | * | 1/1996 | Stalder et al. | 250/305 |
| 5,506,413 A | | 4/1996 | Enloe | |
| 5,541,409 A | | 7/1996 | Enloe | |

* cited by examiner

*Primary Examiner*—John R. Lee
*Assistant Examiner*—David A. Vanore
(74) *Attorney, Agent, or Firm*—Gerald B. Hollins; Thomas L. Kundert

(57) ABSTRACT

A charged particle analyzer electrode assembly of miniaturized physical size and photolithographic process element fabrication capability. The provided electrode assembly is made of conductive materials including semiconductor materials and metal materials. Individual electrodes in the assembly are made of for example plural layers of semiconductor or metal held in place by discrete insulator layers. Bandpass particle energy selection characteristics are achieved in the analyzer through a combination of analyzer particle path geometry configuration and the particle acceleration electrical potential selection. Selected particles are allowed to pass through the analyzer under these influences and non selected particles are excluded. Assembly of individual analyzer electrode assemblies into a multiple element analyzer array usable for example on an aircraft or spacecraft is included. Both millimeter sized and micrometer sized arrangements of the invention are contemplated.

19 Claims, 4 Drawing Sheets

LAMINATED ELECTROSTATIC ANALYZER

RIGHTS OF THE GOVERNMENT

The invention described herein may be manufactured and used by or for the Government of the United States for all governmental purposes without the payment of any royalty.

BACKGROUND OF THE INVENTION

Charged particles including electrons and ions are often encountered in the technical laboratory as well as in space endeavors and other natural environments. In the former instance, ionized particles are for example used in many semiconductor device-processing arrangements including impurity implantations, surface cleaning procedures and small object viewings. In the latter instance, charged particles often appear in vehicle extraterrestrial environments, in vehicle propulsion arrangements and in other plasma related situations including for example the Aurora Borealis phenomenon.

An energy analysis of the electron and ion particles found in these situations is often desirable in order to offset or accommodate the effects of charged particles on sensitive equipment encountering the particles. This analysis has heretofore been accomplished by sizable elements establishing particle controlling electrical fields capable of steering received particles into a predictable trajectory with electronic lens elements. A charged particle electrode assembly or lens assembly built around a plurality of machined analyzer electrodes disposed with the use of conventional hardware, e.g. fastener hardware passing through the electrodes, has been used in the past for such charged particle electrode assemblies or lens assemblies. In the lens assembly particles of a given energy are steered to different physical locations depending on the speed and direction with which they enter the device. The analyzer electrodes may be disposed in a variety of different patterns, patterns comprising either an energy high pass apparatus or an energy band pass apparatus. As suggested in this paragraph, an attempt is made herein to use the word "assembly" in referring to charged particle energy analyzer electrodes or collections of these electrodes into a single charged particle energy analyzer and subsequently to use the word "array" in referring to a plurality of charged particle energy analyzers joined together in a common group.

Energy analysis of charged particles is thus typically performed by some form of an electrostatic lens, hence the term electrostatic analyzer. Various arrangements of electrodes produce electric fields in such a device so that particles of a given energy are steered through the device. The number of possible electrode configurations used to accomplish this process is myriad; nonetheless each of these configurations falls into the categories of high-pass devices, in which charged particles of less than a given energy are rejected and only those with energy greater than a certain threshold are passed, and band-pass devices in which a narrow range of particle energies Is allowed to pass through the analyzer while particles with energies outside this range, both on the high and low ends of an energy range, are rejected. The present invention charged particle energy analyzer falls into the second category of devices and is regarded as a band-pass energy filter device.

The shapes of electrodes used in a charged particle energy analyzer can be simple (e.g. cylinders, spheres, etc.) or complex; such electrodes are usually machined from metal using conventional machining techniques such as milling or lathe turning. The machining techniques applied often limit the degree to which the size of these electrodes can be reduced, as do the size of the fasteners, such as machine screws, used to assemble the electrodes. Some devices, notably the planar retarding potential analyzer, employ fine metal screens to establish electrostatic potentials. Such screens can be made relatively fine using electro-chemical milling, at the expense of their being fragile. The charged particle energy analyzer of the present invention however is arranged so that it can be made quite small without sacrificing its ruggedness or its precision.

SUMMARY OF THE INVENTION

The present invention provides a charged particle electrostatic analyzer electrode assembly capable of low cost, accurate, repeatable micro-sized realization.

It is therefore an object of the present invention to provide a charged particle energy electrostatic analyzer that is small in physical size and capable of use in aircraft, spacecraft or other confined locations.

It Is another object of the invention to provide a charged particle electrostatic analyzer having internal electrodes of accurately controlled physical dimensions.

It is another object of the invention to provide a charged particle electrostatic analyzer electrode assembly that can be accurately reproduced in any desired quantity.

It is another object of the invention to provide a charged particle electrostatic analyzer electrode assembly that is compatible with fabrication using integrated circuit technology.

It is another object of the invention to provide a charged particle electrostatic analyzer electrode array comprising a plurality of charged particle energy analyzer electrode assemblies and capable of low-cost, accurate, repeatable micro-sized realization.

It is another object of the invention to provide a charged particle electrostatic analyzer of increased measurement accuracy capability by way of having precisely located and sized component electrodes.

It is another object of the invention to provide a charged particle electrostatic analyzer having a laminated internal electrode structure.

It is another object of the invention to provide a charged particle electrostatic analyzer electrode assembly comprised of layers of doped silicon semiconductor material.

It is another object of the invention to provide a charged particle electrostatic analyzer comprised of stacked etched through silicon semiconductor material layers.

It is another object of the invention to provide a miniaturized charged particle electrostatic analyzer in which electric fields within the analyzer steer charged particles of a selected energy range between input and output ports of the analyzer.

It is another object of the invention to provide a miniaturized charged particle electrostatic analyzer in which electrical potential applied to one or more analyzer electrodes is used to control the particle energy filtering characteristics of the analyzer.

It is another object of the invention to provide a charged particle energy analyzer that is improved in certain ways over the analyzers disclosed in my prior U.S. Pat. No. 5,506,413 and 5,541,409; each of these prior patents is however incorporated by reference herein.

It is another object of the invention to provide a charged particle electrostatic analyzer in which miniaturized particle steering electrodes are used to enable reduction of the charged analyzer electrodes to the 50–100 nanometer physical size range.

These and other objects of the invention will become apparent as the description of the representative embodiments proceeds.

These and other objects of the invention are achieved by miniaturized charged particle plasma analysis apparatus comprising the combination of:

a first conductive material electrode having circular apertures photolithographically disposed therein;

a second conductive material electrode having slot apertures, selectively aligned with said first conductive material electrode circular apertures, photolithographically disposed therein;

a third conductive material electrode having photolithographically disposed slot apertures, selectively aligned with said first conductive material electrode circular apertures and said second conductive material electrode slot apertures, located therein;

said first, second and third conductive material electrodes being assembled into a multiple electrode plasma analysis stack of physically isolated electrodes wherein said second conductive material electrode is also electrically isolated from a common interconnection of said first and third conductive material electrodes;

a source of selected electrical potential connected between said second conductive material electrode and said common interconnection of said first and third conductive material electrodes; and a particle collection electrode member located adjacent said third conductive material electrode and connected via a current measuring element with a particle collection energy source.

BRIEF DESCRIPTION OF THE DRAWING

The accompanying drawings incorporated in and forming a part of the specification, illustrate several aspects of the present invention and together with the description serve to explain the principles of the invention. In the drawings.

DETAILED DESCRIPTION OF THE INVENTION

The present charged particle energy analyzer invention allows a user to determine the energy of charged particles (e.g., ions and electrons) such as those found in laboratory plasmas and in the ionosphere. It uses electric fields, the configuration of which are determined by the geometry of the device's electrodes, to modify the trajectories of particles moving within the device. Only particles entering the energy analyzer with energies in a given range, proportional to the voltage applied to the device's inner electrodes, will be steered so as to exit the device. The charged particle energy analyzer thus operates as a charged particle energy filter.

The arrangement of the present charged particle energy analyzer is believed distinguished from other such devices in that the electrodes are not machined conventionally, but rather consist of patterned holes etched in thin sheets of conductive material, separated by thin sheets of an insulating material. A significant characteristic of this arrangement is that it is inherently adaptable to miniaturization. A variety of materials may be used in fabricating the electrodes.

The present invention charged particle energy analyzer is believed usable in a number of technical endeavors, including for example, measurement of ionospheric plasma in order to predict plasma impact on military and other satellite operations. The present device is also usable in the measurement of perturbations to the local space plasma environment in the vicinity of spacecraft using electric propulsion systems in order to assess and predict the effects of propulsion system function on spacecraft operations. The device may also be used in the measurement of plasma parameters in plasma processing systems in order to assess impacts on processing quality and to predict the inputs available for control loop operation.

Figure 1:
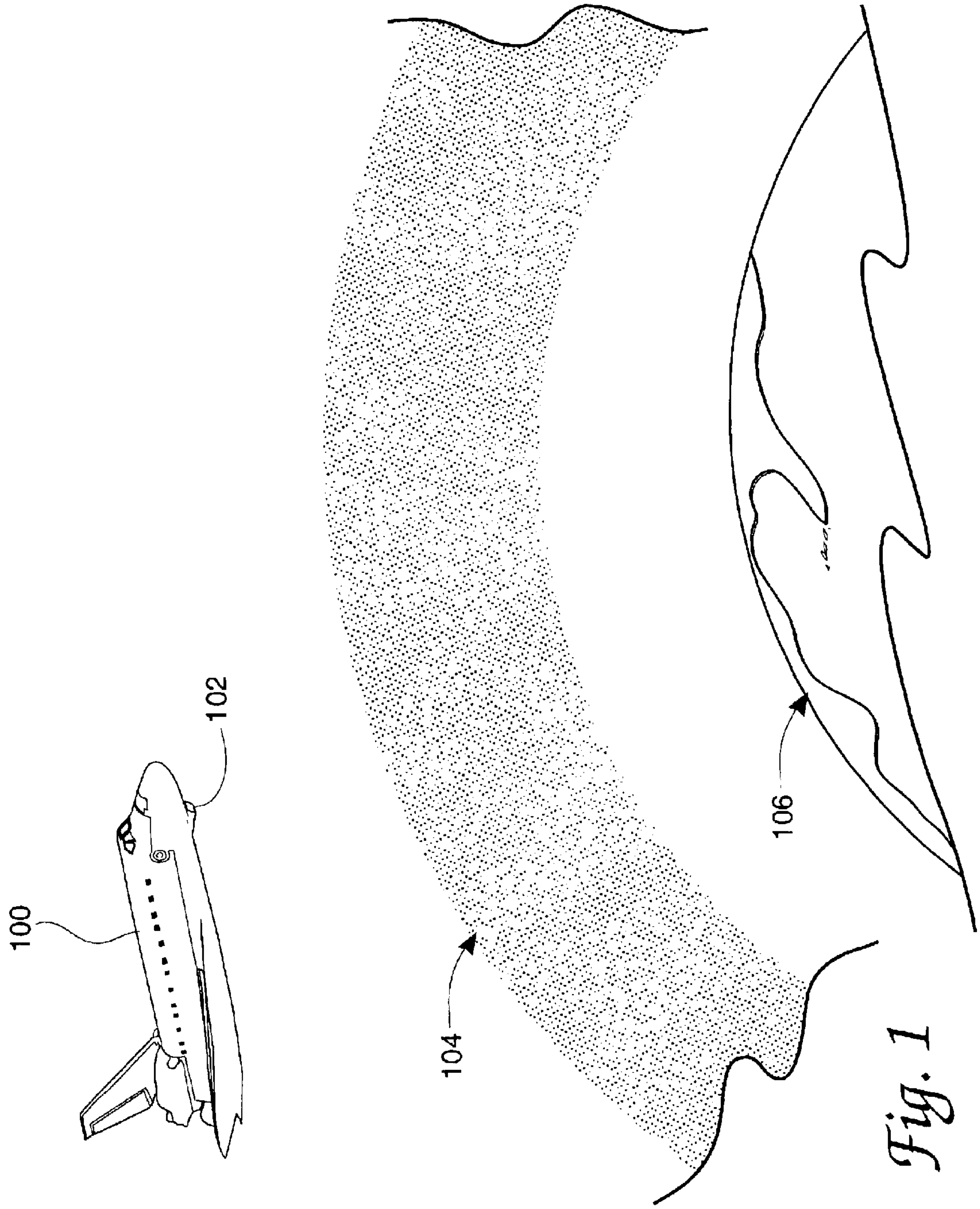
FIG. 1 shows a representative scene in which the present invention charged particle energy analyzer may be useful.

FIG. 1 in the drawings therefore shows a scene in which a charged particle energy analyzer according to the present invention may be useful. In the FIG. 1 drawing a spacecraft such as the U.S. space shuttle craft 100 is shown to be approaching a region 104 of charged particles in the course of a return to earth 106 following a space mission. For present purposes it is assumed that the spacecraft 100 is yet disposed in a flight configuration allowing entry of charged particles from the region 104, by way of an open port 102, into a charged particle energy analyzer apparatus located within the spacecraft 100 but not shown in the FIG. 1 drawing. Subsequent closure of the port 102 or another arrangement precluding entry of earth's atmosphere reentry byproducts into the spacecraft and the charged particle energy analyzer apparatus is presumed in the FIG. 1 scene. Other uses of the present invention may of course intentionally collect charged particle samples originating in the atmospheric reentry sequence for use in the charged particle energy analyzer of spacecraft 100. The relatively small size and weight penalties associated with a charged particle energy analyzer according to the present invention is notably useful in spacecraft and aircraft uses of the invention, especially in instances wherein smaller craft than the represented space shuttle 100 are involved.

Figure 2:
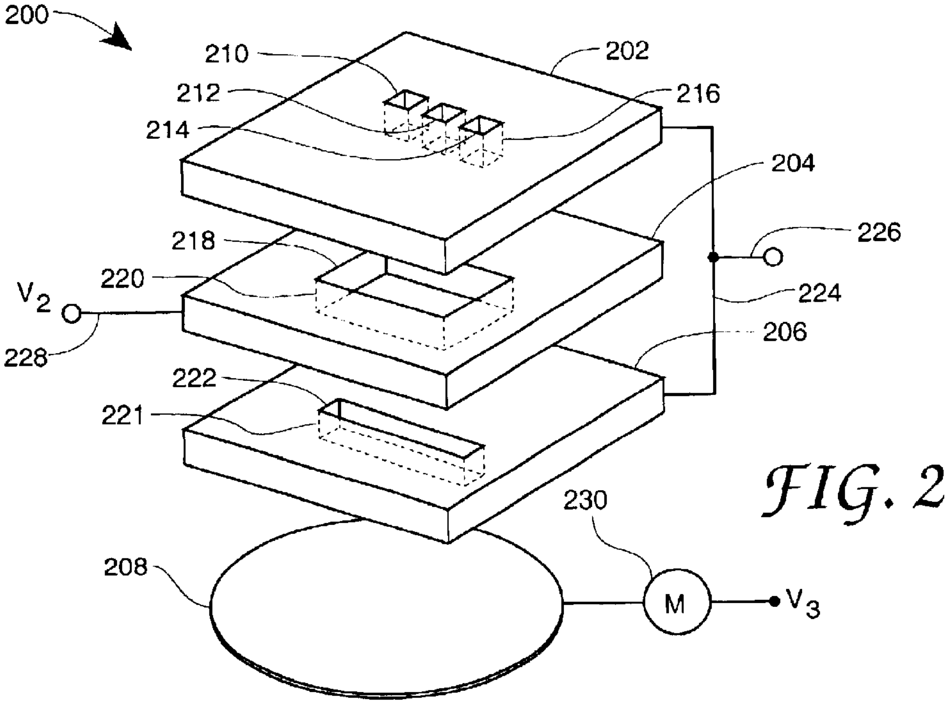
FIG. 2 shows significant elements of a charged particle energy analyzer element electrode stack according to the present invention.

FIG. 2 in the drawings shows the fundamental elements of a charged particle energy analyzer 200 made according to the present invention. As shown in this drawing the analyzer 200 consists of three stacked, conducting or semiconducting layers 202, 204 and 206 with patterns of holes and slots cut in each. These layers 202, 204 and 206 are separated by layers of insulating material, which for clarity are not shown in FIG. 2. The patterns in each conducting layer 202, 204 and 206 are preferably etched into the material of the layer by photolithography. Such photolithographic etching is preferably used in both a semiconductor and a metallic (e.g. stainless steel) layer arrangement of the present invention. The photolithographic etching may be accomplished in the manner common in the semiconductor industry to fabricate integrated circuits and microelectromechanical systems (or MEMS) devices; additional details regarding such etching are included in the documents identified subsequently herein.

In the FIG. 2 charged particle energy analyzer the top electrode or plate 202 is patterned with a series of holes, while the middle and bottom electrodes or plates 204 and 206 are patterned with slots, the bottom plate slot being smaller in area than the slot of the middle plate; As is indicated by the dotted lines 216 in FIG. 2 the holes or apertures 212, 214 and 216 in the top plate 202 extend entirely through the plate 202 in substantially uniform cross section, a condition also indicated at 220 and 221 for the other plates in FIG. 2. A voltage $V_1$ (often ground potential, unless it is desirable to pre-accelerate particles in the device) is applied to both the top and bottom plates 202 and 206 by way of the leads 224 and 226. A different voltage $V_2$ is applied to the middle plate 204 by way of the lead 228. The sign of the voltage $V_2$ is chosen so as to be repelling to the species of charged particle under analysis (a negative voltage for electrons, a positive voltage for ions). Because the voltage $V_2$ is repelling, selected electron particles are steered through the FIG. 2 device by the electric fields within it. Only particles of a given kinetic energy level, entering within a certain solid angle, are steered from the entrance holes or apertures 210, 212 and 214 in the top plate 202 to the exit aperture 222 in the bottom plate 206 and thereby arrive at the particle collection electrode 208.

The particle collection electrode 208 is operated at some additional voltage level $V_3$, a voltage that is made to be attractive to the species of charged particle under analysis. The $V_3$ voltage is thus made to be positive for analyzing electron charged particles and negative for analyzing positively charged ion particles. A current measuring device as is represented by the meter 230 may be used to indicate the quantity of charged particles having the correct energy level and course of travel to reach the particle collection electrode 208. In a refined embodiment of the invention the meter 230 may of course be replaced with a current sensing resistance or other current responsive element in order to process the current flow signal from collection electrode 208 electronically. The magnitude of the voltage V3 is selected to assure capture of all charged particles exiting from the aperture 222 but small enough to be of little influence on particle kinetics; a voltage in the range of 10 V or greater is preferred.

Figure 3:
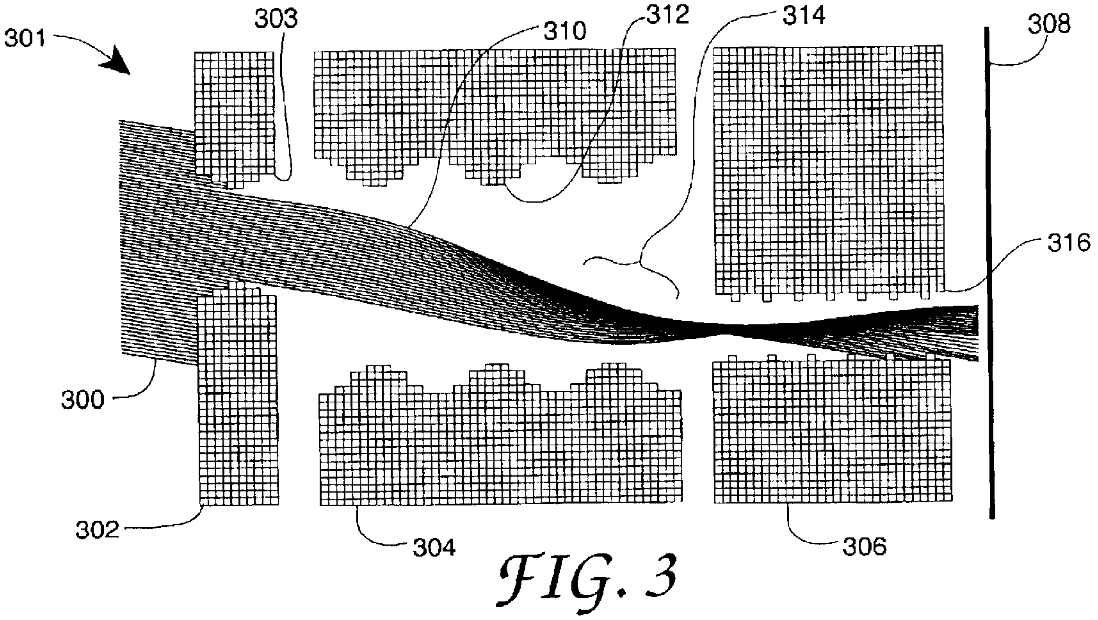
FIG. 3 shows a representative charged particle flow in a charged particle energy analyzer element according to the present invention.

FIG. 3 in the drawings shows a flow of selected charged particles being steered in the desired manner through the configured path of a prototype charged particle energy analyzer electrode assembly 301. The flow 310 of charged particles shown in FIG. 3 enters one or more apertures 303 in the "top" plate 302 from the source 300, traverses the aperture 312 in the middle plate 304 and the smaller aperture 316 in the lower plate 306 to finally reach the collection electrode 308. The charged particles emerging from the aperture 316 in the FIG. 3 particle energy analyzer are of course those which entered the one or more apertures 303 with the appropriate combination of kinetic energy and charge so as to thread the path through the three apertures 303, 312 and 316 under the influence of the repelling potential applied to the middle plate 304; other particles are excluded from this select group and in fact primarily collide with one or more of the aperture 303, 312 and 316 or adjacent surfaces. This charged particle behavior in the FIG. 3 particle energy analyzer is in fact a demonstration of the bandpass energy filtering action of the present invention. The twisting and flow-shaping action of the particle stream 310 shown at 314 in FIG. 3 is representative of the mechanism achieving this electric field induced band-pass energy filtering action.

The plates 302 and 306 in the FIG. 3 charged particle energy analyzer are normally operated at the same electrical potential, usually ground potential, however in certain instances, wherein it is desirable to pre accelerate the particle under examination into or away from the FIG. 3 apparatus, it can be advantageous to operate one or more of plates 302 and 306 at some different potential. Grounded operation of plates 302 and 306 provides the additional advantage of human safety in operating and maintaining the charged particle energy analyzer. The surfaces of the three apertures 303, 312 and 316 in FIG. 3 are shown to be of a non planar or irregular texture because the etching process used in the prototype, namely etching of a metal such as stainless steel, leaves a non-planar edge on the etched holes and slots, as a result of undercutting by the chemical etchant during the etching process. As the FIG. 3 drawing implies, the charged particle energy analyzer configuration illustrated in the previously discussed FIG. 2 drawing is notional rather than being to scale. In reality the relative dimensions of the openings in each of the analyzer plates can be adjusted, within broad parameters, to tailor the acceptance energy range and acceptance angle of the present invention charged particle energy analyzer to specific applications.

Generally in order for the charged particle energy analyzer of the present invention to function most efficiently, the sizes of the entrance and exit apertures should be made smaller than the opening in the middle plate. The entrance and exit apertures are also radially offset in opposite directions, relative to the center of the opening in the middle plate, so that particles passing through the device undergo the "s-turn" trajectory depicted at 314. Although It is not strictly necessary, it Is desirable to make the aspect ratio (the ratio of the length to the diameter or width of the opening) for both the entrance and the exit apertures of the charged particle energy analyzer large enough to preclude existence of a direct path through the device, a direct path that may be traversed by light or high-energy charged particles.

Figure 4:
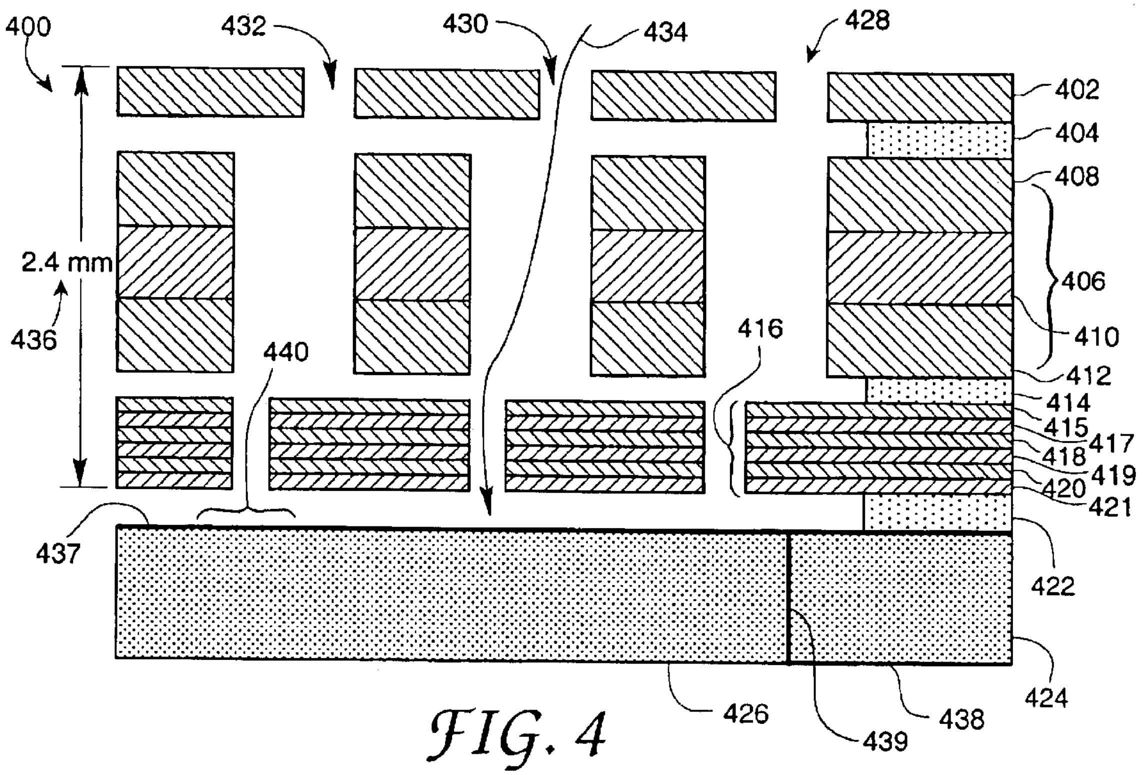
FIG. 4 shows detailed elements of a charged particle energy analyzer array according to the present invention.

When a chemical etching process is used to pattern holes in metallic material-embodied plates for the charged particle energy analyzer the aspect ratio of a hole in any given metallic plate can be limited by etching restrictions to being less than one. In such a situation several individual patterned metallic laminations may be combined to form one or more plates in the analyzer in order to increase the effective aspect ratio of the assembled metallic plate. Such a plurality of laminations plate arrangement is shown in the drawing of FIG. 4 herein. A similar laminated plate arrangement may also be used when one or more of the plates in a FIG. 1 through FIG. 4 type charged particle energy analyzer assembly is fabricated from a semiconductor material such as Silicon.

FIG. 4 in the drawings therefore shows a cross-section of a fabricated charged particle energy analyzer 400 made according to the present invention using either semiconductor or metallic plate compositions. In the FIG. 4 drawing the top plate element appears at 402 and the middle plate at 406; in the FIG. 4 apparatus each of the plates are fabricated from either a metal such as stainless steel or a semiconductor material such as Silicon. In the FIG. 4 arrangement of the invention a stack of three individual photolithographically-etched laminations 4085 410 and 412 are used to assemble the middle plate 406. This layered or laminated plate arrangement in fact provides the basis for the term "laminated" used in the title of the present patent document. Since the achievable aspect ratio of the openings in each layer shown in FIG. 4 is often limited by the etching technology several individual laminations are stacked together to achieve each of the FIG. 4 energy analyzer plates 406 and 416. The plate 416 is the bottom plate in the FIG. 4 apparatus; as shown in FIG. 4 a stack of six laminations 415, 417 418, 419, 420 and 421 is used to assemble this bottom plate 416.

Notably in a charged particle energy analyzer assembly fabricated from semiconductor or silicon laminations, as the FIG. 4 drawing herein may be considered to represent, higher lamination opening aspect ratios can also be obtained more expediently in each lamination by using, for example, plasma etching techniques and taking advantage of the crystalline structure of the semiconductor material itself. This may be accomplished by optimally orienting the lamination opening with respect to the crystal orientation of the semiconductor material while shaping an individual lamination or plate opening and thereby taking advantage of the known faster etching rates occurring in some directions of the semiconductor material.

Thin Teflon® or like material spacers appear at 404 and 414 in the FIG. 4 charged particle energy analyzer. A thick Teflon® spacer appears at 422 below the bottom plate of the FIG. 4 stack. The printed circuit (PC) board upon which the FIG. 4 analyzer is mounted appears at 424 in the FIG. 4 drawing. Metallization received on the PC board 424 appears at 437 and 438; this includes the top collector surface 440 corresponding to the collection electrodes 208 and 308 shown in the FIG. 2 and FIG. 3 drawings herein. This top collector surface 440 is connected to current multiplying and/or metering circuitry by way of the extended metallization at 438 which may include a plated-through hole or other top to bottom surface electrical connection as is represented at 439 in FIG. 4. The portion of the of the printed circuit board at 426 remains electrically insulating in nature and may be used for analyzer mounting purposes.

The charged particle energy analyzer of the present invention can be fabricated singly or in analyzer arrays. The FIG. 4 drawing in fact shows an array of three such charged particle energy analyzer devices, the devices having upper plate openings at 428, 430 and 432 in FIG. 4. Arrays larger than the FIG. 4 three-element array are of course possible and are desirable in for example natural phenomenon-related uses of the invention. The charged particle path for the centermost of the FIG. 4 analyzer assembly is indicated at 434 in the FIG. 4 drawing. The overall thickness dimension of the FIG. 4 analyzer array is indicated at 436 to be 2.4 millimeters. This 2.4 millimeters dimension is considered to represent a scaled-up embodiment of the invention that is convenient for initial concept and early development uses, uses in for example an academic environment where student assistance and less than state of the art fabrication facilities are most convenient. Refined versions of the invention, especially versions contemplated for use in space applications, and made according to later states of the semiconductor fabrication art, are viewed as desirably having an overall height dimension of 50 to 100 micrometers in lieu of this 2.4 millimeters. These refined versions are contemplated to include corresponding reductions of dimensions along the other two axes of the array. Individual charged particle energy analyzer assemblies according to this smaller array size are of course also contemplated to come within the scope of the invention.

Figure 5:
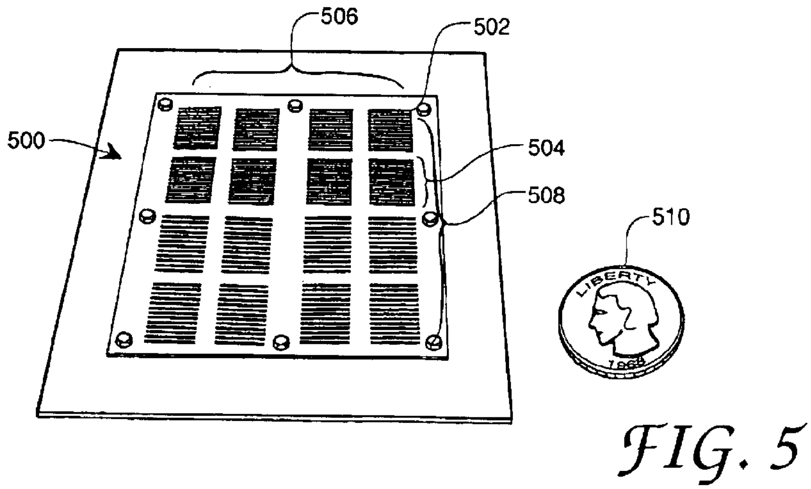
FIG. 5 shows charged particle energy analyzer elements disposed in a larger array device.

FIG. 5 in the drawings shows a somewhat larger array 500 of charged particle energy analyzer devices etched into approximately 25 $cm^2$ of detector array surface; the FIG. 5 array includes a total to 1920 individual analyzer elements disposed in a 5 centimeter by 5 centimeter area. In the FIG. 5 drawing 120 individual analyzer elements are located in each of the illustrated 16 clusters 504; four such clusters are disposed in each horizontal row 506 and four clusters are disposed in each vertical column 508. Twelve individual analyzer elements are located in each of the 10 rows of a cluster 504 in the FIG. 5 array. A twenty-five cent U.S. coin appears at 510 in the FIG. 5 drawing (which represents an actual photograph) for size reference purposes. The FIG. 5 drawing represents a Patent Draftsman's rendition of an actual photograph. Conventional current sensing electronics may be used to measure the charged particle current passing through the FIG. 5 charged particle energy analyzer; this is in lieu of a more complex charge multiplication scheme as may be advantageous with smaller array sizes. In instances where charge multiplication can be used, a single analyzer element stack or a small array of analyzer stacks can accomplish similar measurement to the larger array represented in the FIG. 5 drawing.

Figure 6:
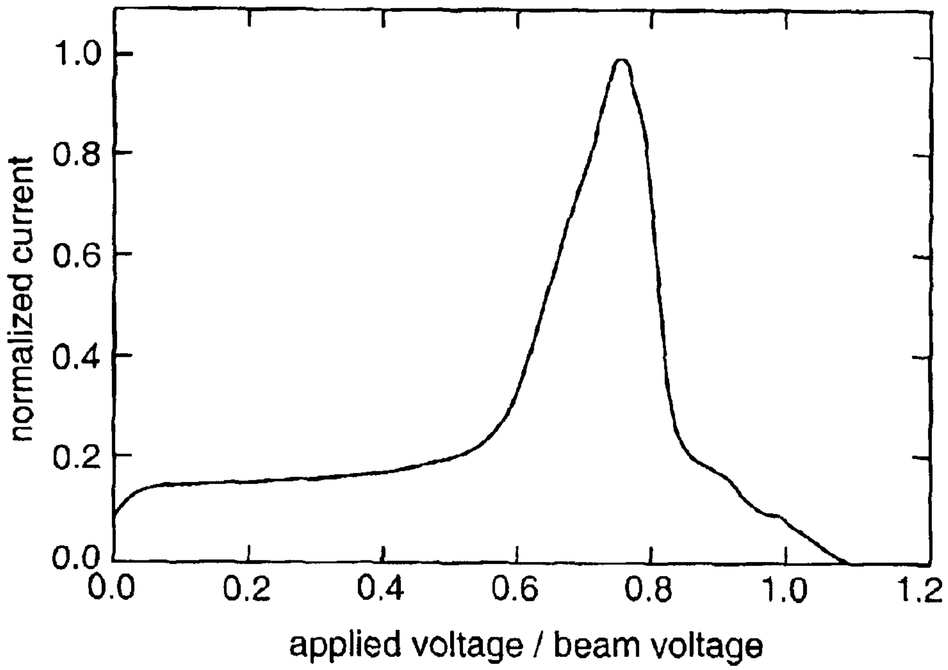
FIG. 6 shows the bandpass filter characteristics of a charged particle energy analyzer electrode stack.

A charged particle energy analyzer may be tested by placing it in a highly monoenergetic beam of electrons and observing its response—that is, by measuring the current of electrons passing through the device as a function of the voltage applied to the middle plate electrode of the device. The results of such a test are shown in the drawing of FIG. 6 herein. The beam employed in the FIG. 6 test has a full width half maximum (FWHM) value of 0.66 eV for beam energies of 10–25 electron volts. Compared to the range of energies that the device will pass, this value is small, so that FIG. 6 accurately represents the response of the device. FIG. 6 presents the response normalized to the beam voltage. In other words, we would expect that if the beam voltage was set at 10 V, the device would have a maximum response with 7 V applied to the center electrode. If the beam voltage were 20 V, the maximum response of the device would be with 14 V applied, etc. The FIG. 7 drawing shows response of the charged particle energy analyzer as a result of this electron beam as a function of the voltage applied to the middle plate of the analyzer. As predicted, the charged particle energy analyzer operates as a bandpass energy filter. The tail of the FIG. 6 response for $V_{app}/V_{beam}$ being less than 0.5 is a result of the relatively wide entrance aperture chosen for the tested charged particle energy analyzer configuration, a configuration selected to increase sensitivity in detecting plasma depletions in the ionosphere.

Continuing with FIG. 6, this drawing thus shows the expected behavior of a band-pass energy filter for the tested charged particle energy analyzer; this response is strongly peaked at a given applied voltage i.e., at a ratio of applied voltage to beam voltage of about 0.75 in the case of the tested charged particle energy analyzer geometry. The drawing of FIG. 6 shows the response of the device with the applied voltage normalized to the beam energy. The FIG. 6 relative response is the same over a wide range of beam energies, meaning that the response of the device is linear with the applied voltage. This linear response is shown in the relationship of the FIG. 7 drawing.

Figure 7:
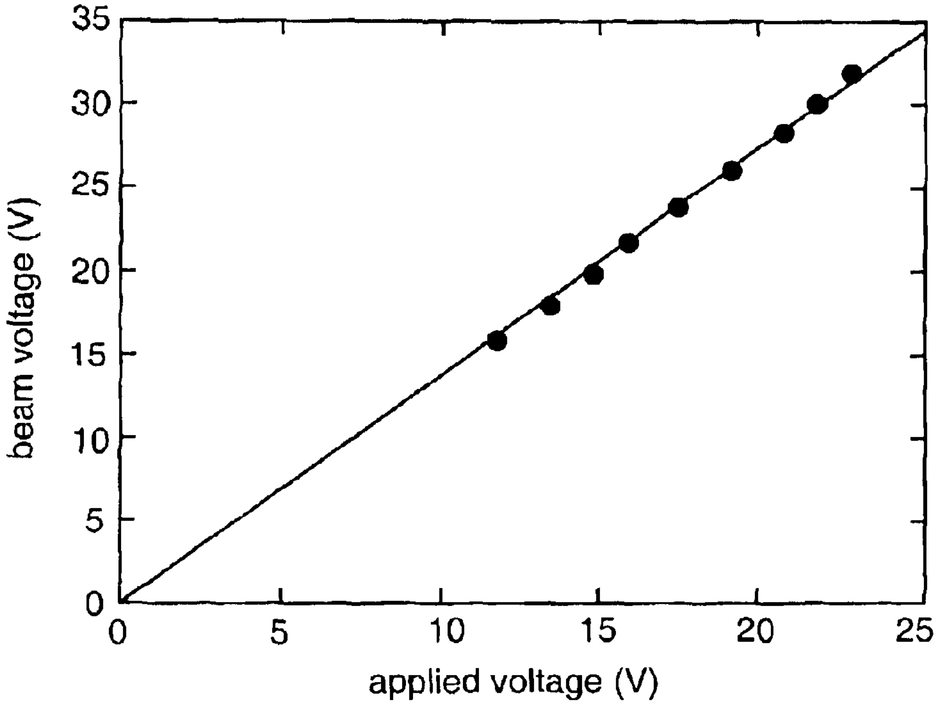
FIG. 7 shows the relationship between beam electron energy and beam voltage in a charged particle energy analyzer electrode stack according to the present invention.

FIG. 7 shows that the response of the present invention analyzer to various energy electron beams is linear, as appears In this plot of the beam voltage versus the applied voltage at which the detector response is maximized. The analyzer constant of this configuration is 1.35. In other words, if the response of the device is maximized at 10 V, we may assume that the input is peaked at 13.5 V. Since the response of the device is linear, then we may relate the input to the output via a simple multiplication, as shown in this example, rather than through a more complex mathematical unfolding.

The processing of semiconductor and metal materials in order to achieve the charged particle energy analyzer electrode assembly of the present invention may be accomplished in accordance with processes that are known in the semiconductor and metal fabrication arts. With respect to the fabrication of silicon charged particle controlling electrodes or layers or plates, processes or combinations of processes such as are disclosed in the U.S. Pat. Nos. 4,089,103; 4,370,192; 4,753,896; 5,168,071; 5,217,564; 5,256,563 and 5,310,624 may for examples be used for present invention purposes. Additionally processes of the type disclosed in the standard reference texts "Silicon Processing for the VLSI Era" by Stanley Wolf and Richard Tauber, Lattice Press, 1986, and in "VLSI Technology" by S.M. Sze editor, McGraw-Hill, 1986, may be included in this list. Each of these patent and text references is hereby incorporated by reference herein.

With respect to the fabrication of stainless steel charged particle controlling electrodes or plates, processes or combinations of processes such as are disclosed in the U.S. Pat. Nos. 3,931,454; 4,528,070; 4,902,607 5,104,480; and 5,374,338 may for examples be used. Additionally techniques of the type disclosed in the publications "Micro-EDM" by Li, H. and Masaki, T., Society of Manufacturing Engineers Technical Paper, MS 91-485; "Micro-Electro-Discharge Machining" by T. Masaki, K Kawata, T. Sato, T. Mizutani, K. Yonemoti, A. Shibuya and T. Masuzawa, Proceedings of International Symposium for Electro-Machining, pp. 26–29, 1989; "Micro EDMing Excites the High Tech Community" EDM Today, pp. 32, 34, 46, March/April 1991; "Micro Electro-Discharge Machine Brochure" Panasonic Matsushita Research Institute, May 1990; "Electrical Discharge Machining" by Dr. Hong Li, SME, presented at the Society of Manufacturing Engineers and the Machining of SME, Sep. 17–18, 1991, may be included in this list. Each of these patent and publication references is also hereby incorporated by reference herein.

The charged particle energy analyzer of the present invention is thus compatible with MEMS fabrication techniques, in which layers of silicon and silicon dioxide are deposited and patterned on the microscopic level. The photolithographic etching of the metal plates used in constructing one arrangement of the invention is also believed a novel fabrication method for a charged particle device that is still macroscopic in scale. In space-borne applications of the invention where size and mass relate directly to the cost to launch a payload, the achieved high levels of miniaturization are a distinct advantage of the present charged particle energy analyzer. The advantage of miniaturization is also significant in laboratory and manufacturing plasma environment uses of the described energy analyzer, since the smaller the probe, the smaller the perturbation it induces into the system being monitored. A charged particle energy analyzer according to the invention is being prepared for space launch as the primary scientific payload of the U.S. Air Force Academy FalconSat-2 satellite.

The present invention therefore provides an improved charged particle energy analyzer in which electrodes of the device are laminated and therefore, for what is believed to be the first time, can be fabricated with the accuracy and repeatability of photolithography. Moreover because the charged particle energy analyzer can be so fabricated with photolithography, it can also be miniaturized to a high degree and is more suited to use in space applications.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

I claim:

1. Miniaturized charged particle plasma analysis apparatus comprising the combination of:

a first conductive material electrode having circular apertures photolithographically disposed therein;

a second conductive material electrode having slot apertures, selectively aligned with said first conductive material electrode circular apertures, photolithographically disposed therein;

a third conductive material electrode having photolithographically disposed slot apertures, selectively aligned with said first conductive material electrode circular apertures and said second conductive material electrode slot apertures, located therein;

said first, second and third conductive material electrodes being assembled into a multiple electrode plasma analysis stack of physically isolated electrodes wherein said second conductive material electrode is also electrically isolated from a common interconnection of said first and third conductive material electrodes;

a source of selected electrical potential connected between said second conductive material electrode and said common interconnection of said first and third conductive material electrodes; and a particle collection electrode member located adjacent said third conductive material electrode and connected via a current measuring element with a particle collection energy source.

2. The miniaturized charged particle plasma analysis apparatus of claim 1 wherein said first, second and third conductive material electrodes are comprised of one of a metallic material and a doped semiconductor material.

3. The miniaturized charged particle plasma analysis apparatus of claim 1 wherein selected of said first, second and third conductive material electrodes are comprised of multiple layers of said conductive material.

4. The miniaturized charged particle plasma analysis apparatus of claim 1 wherein said apertures in said first, second and third conductive material electrodes are also aligned in selected curving charged particle trajectory-accommodating alignment.

5. The miniaturized charged particle plasma analysis apparatus of claim 1 wherein said source of selected electrical potential has a magnitude selected in response to intended particle energy bandpass characteristics in said charged particle plasma analysis apparatus.

6. The miniaturized charged particle plasma analysis apparatus of claim 3 further including a plurality of said multiple layered plasma analysis electrode stacks assembled into a plasma analysis array.

7. The miniaturized charged particle plasma analysis apparatus of claim 3 wherein selected of said first, second and third conductive material layers are comprised of doped semiconductor material disposed in discrete layers.

8. The miniaturized charged particle plasma analysis apparatus of claim 7 wherein said first, second and third conductive material layers disposed in discrete layers are stacked into three electrically insulated elements having a total thickness of two and four tenths millimeters.

9. The miniaturized charged particle plasma analysis apparatus of claim 1 further including a plurality of said multiple electrode plasma analysis stacks comprising a charged particle energy analyzer array.

10. The miniaturized charged particle plasma analysis apparatus of claim 1 wherein said first, second and third conductive material layers disposed in discrete layers are stacked into three electrically insulated elements having a total thickness between 50 and 100 micrometers.

11. Miniature electrostatic analyzer silicon electrode apparatus comprising the combination of:

a first layer of doped single crystal silicon material having a selected pattern of etched-through hole openings disposed therein;

a second layer of doped single crystal silicon material having a selected pattern of etched-through slot openings, of selected lateral displacement with respect to said etched-through hole openings, disposed therein;

said first and second layers of doped single crystal silicon material being disposed in physically segregated stacked assembly;

a third layer of doped single crystal silicon material having a selected pattern of etched-through slot openings, of selected lateral displacement with respect to said second layer selected pattern of etched-through slot openings, disposed therein;

said third layer of doped single crystal silicon also being disposed in physical segregation from said second layer in said stacked assembly; and a source of selected electrical potential of selected magnitude connected between said second layer of doped single crystal material and one of said first and third layers of doped single crystal material in said assembly.

12. The miniature electrostatic analyzer etched silicon electrode apparatus of claim 11 further including a plurality of said silicon electrode stacked assemblies disposed in selectively configured lateral array disposition.

13. The miniaturized charged particle plasma analysis apparatus of claim 5 wherein said source of selected electrical potential has a magnitude selected to steer particles of selected charge polarity, energy level and entering orientation through said electrode apertures.

14. The miniaturized charged particle plasma analysis apparatus of claim 13 wherein said particles of selected charge polarity are negatively charged electrons.

15. The miniaturized charged particle plasma analysis apparatus of claim 13 wherein said particles of selected charge polarity are positively charged ions.

16. The miniaturized charged particle plasma analysis apparatus of claim 5 wherein said second layer electrical potential has a polarity repelling output particles of said apparatus.

17. Etched semiconductor electrodes miniature energy band pass filtering electrostatic analyzer apparatus comprising the combination of:

a first photolithographically etched apertures-inclusive semiconductor electrode member received in a stack of semiconductor electrode members;

a second photolithographically etched larger apertures-inclusive semiconductor electrode member received in said stack of semiconductor electrode members;

a third photolithographically etched smallest apertures-inclusive semiconductor electrode member received in said stack of semiconductor electrode members;

a selected charged particle collecting electrode element located adjacent said third photolithographically etched smallest apertures-inclusive semiconductor electrode member in said stack of semiconductor electrode members and disposed at a first selected electrical potential;

electrical insulation layer members received intermediate said first, second and third semiconductor electrode members and said selected charged particle collecting electrode element in said stack; and charged particle repelling second electrical potential source means connected between said second semiconductor electrode member and one other of said semiconductor electrode members for steering selected of said charged particles through said apertures in said stack of semiconductor electrode members in a second electrical potential-shaped flowing stream terminating with said selected charged particle collecting electrode element.

18. The etched semiconductor electrodes miniature energy band pass filtering electrostatic analyzer apparatus of claim 11 further including electrical current flow sensing means connected with said selected charged particle collecting electrode element for measuring an electrical current flow generated by said flowing stream.

19. The etched semiconductor electrodes miniature energy band pass filtering electrostatic analyzer apparatus of claim 17 wherein one of said photolithographically etched apertures-inclusive semiconductor electrode members is comprised of a plurality of semiconductor layers.

* * * * *